US009530338B2

(12) United States Patent
Huang et al.

(10) Patent No.: US 9,530,338 B2
(45) Date of Patent: Dec. 27, 2016

(54) DRIVING CIRCUIT HAVING BUILT-IN-SELF-TEST FUNCTION

(71) Applicant: Raydium Semiconductor Corporation, Hsinchu (TW)

(72) Inventors: Chih-Chuan Huang, Kaohsiung (TW); Ko-Yang Tso, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 338 days.

(21) Appl. No.: 14/157,165

(22) Filed: Jan. 16, 2014

(65) Prior Publication Data

US 2014/0197868 A1 Jul. 17, 2014

(30) Foreign Application Priority Data

Jan. 17, 2013 (TW) ............................ 102101772 A

(51) Int. Cl.
*H03B 1/00* (2006.01)
*H03K 3/00* (2006.01)
*G09G 3/00* (2006.01)
*G09G 3/36* (2006.01)

(52) U.S. Cl.
CPC ................ *G09G 3/006* (2013.01); *G09G 3/36* (2013.01)

(58) Field of Classification Search
CPC ......... G01R 31/316; H02M 3/10; H02M 1/70; H03K 5/003; H03K 5/24
USPC ... 327/108–112, 427, 434, 437, 170, 77, 78, 327/82, 85, 87, 88, 89, 307; 326/82, 326/83, 87; 345/204, 214, 93, 98, 100; 324/750.3, 324/760.01, 760.02, 763.01, 324/763.02
See application file for complete search history.

(56) References Cited

U.S. PATENT DOCUMENTS 8,810,268 B2 * 8/2014 Huang .................. G09G 3/006 324/750.3
9,083,232 B1 * 7/2015 Agarwal ................ H03M 1/70
2010/0158157 A1 * 6/2010 Iwata ..................... H04L 27/06 375/320
2011/0074505 A1 * 3/2011 Chiang ............... H03F 3/45475 330/127

OTHER PUBLICATIONS

"Amplitude Shift Keying & Frequency Shift Keying", retrieved May 5, 2016, http://www.ele.uri.edu/Courses/ele436/labs/ASKnFSK.pdf.*

* cited by examiner

*Primary Examiner* — Lincoln Donovan
*Assistant Examiner* — Thomas Skibinski

(57) ABSTRACT

A driving circuit includes at least one reference voltage source, at least one offset unit, and at least one buffer module. The at least one reference voltage source generates a reference voltage. The at least one offset unit generates an offset voltage, wherein the offset voltage and the reference voltage form a judging voltage range. The at least one buffer module has a first input end, a second input end, and an output end, wherein the first input end receives an analog voltage; the at least one reference voltage source is connected with the second input end; the at least one buffer module, according as whether the analog voltage is within the judging voltage range, outputs a pass logic signal or a fail logic signal at the output end. Particularly, the buffer module has Built-In-Self-Test (BIST) function and can increase test efficiency and voltage accuracy.

14 Claims, 8 Drawing Sheets

DRIVING CIRCUIT HAVING BUILT-IN-SELF-TEST FUNCTION

BACKGROUND OF THE INVENTION

Field of the Invention

The present invention generally relates to a driving circuit having a built-in-self-test function; particularly, the present invention relates to a source driving circuit which has a judgment mechanism and can increase a driving efficiency.

Description of the Related Art

Generally, a source driving circuit of a display module utilizes an additional test module to test the accuracy of an output voltage. For instance, the test module includes a plurality of test pins, and the test module has a highly-accurate voltage value to determine pass or fail in the output voltage of the driving circuit.

In practical applications, in order to get accurate voltage values, the driving circuit requires enough time to settle in each pixel period, and the settling time depends on a loading level of the output end of the circuit. In addition, when the circuit finishes the settling operation, the test module requires enough time for computing. In other words, the driving circuit requires enough settling time and computing time to execute settling and computing sequentially; however, it yet decreases the test efficiency of the test circuit.

It is noted that the amount of the test pins of the test module is almost (or at least) one thousand pins, and the accurate value of the voltage must be less than 1 mV. However, more pins indicate more material cost of the driving circuit; in addition, the highly-accurate value of the output voltage depends on the performance of the test circuit. A larger amount of pins invisibly increase the hardware cost of the test circuit and the loading of the test time.

For the above reasons, it is desired to design a display driving circuit for decreasing the test time and increasing the voltage accuracy.

SUMMARY OF THE INVENTION

In view of prior art, the present invention provides a driving circuit which has a judgment mechanism and is capable of increasing efficiency.

It is an object of the present invention to provide a driving circuit which can execute built-in-self-test (BIST) to determine the accuracy of the voltage.

It is another object of the present invention to provide a driving circuit which has a digital judgment mechanism to save the test time.

It is another object of the present invention to provide a driving circuit which utilizes a hysteresis comparator, wherein the hysteresis comparator can adjust an offset voltage to control the offset voltage.

The present invention provides a driving circuit which is provided for connecting with a display module. The driving circuit includes at least one reference voltage, at least one offset unit, and at least one buffer module. The at least one reference voltage source generates a reference voltage, and the at least one offset unit generates an offset voltage, wherein the offset voltage and the reference voltage form a judging voltage range. The at least one buffer module has a first input end, a second input end, and an output end, wherein the first input end receives an analog voltage; the at least one reference voltage source is connected with the second input end; the at least one buffer module, according as whether the analog voltage is within the judging voltage range, outputs a pass logic signal or a fail logic signal at the output end.

It is noted that the buffer module includes a digital judgment unit, wherein the digital judgment unit receives the analog voltage and the judging voltage range and, according as whether the analog voltage is within the judging voltage range, selectively outputs a plurality of digital signals, wherein the digital signals include the pass logic signal and the fail logic signal.

Compared to prior arts, the driving circuit of the present invention utilizes the buffer module to determine the accuracy of the analog voltage and, according as whether the analog voltage is within the judging voltage range, execute the digital logic test. Furthermore, the buffer module is a digital judgment buffer module and can determine the accuracy of the voltage by the digital logic mechanism so as to greatly decrease the test time. In addition, the driving circuit of the present invention is a BIST (Built-In-Self-Test) circuit which can directly execute the test in the original module (the driving circuit) without utilizing additional test apparatus so as to decrease the cost of the hardware.

The detailed descriptions and the drawings thereof below provide further understanding about the advantage and the spirit of the present invention.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

According to an embodiment of the present invention, a driving circuit having digital logic test function is provided. In the embodiment, the driving circuit is connected with a display module and can be a driving circuit used for an LCD, but not limited thereto.

Figure 1:
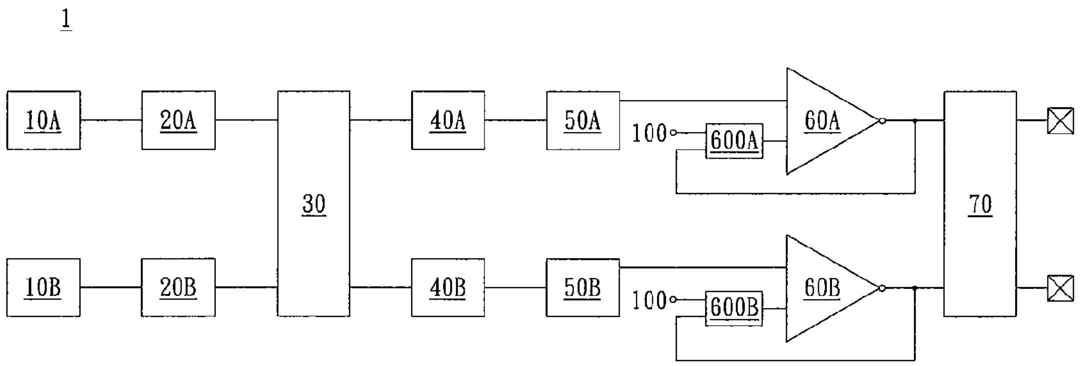
FIG. 1 is a schematic view of an embodiment of a driving circuit of the present invention.

Please refer to FIG. 1; FIG. 1 is a schematic view of an embodiment of a driving circuit of the present invention. As shown in FIG. 1, the driving circuit 1 includes at least one first latch module 10A/10B, at least one second latch module 20A/20B, at least one exchange module 30, at least one voltage conversion module 40A/40B, at least one digital/analog conversion module 50A/50B, at least one buffer module 60A/60B, and at least one high voltage exchange module 70. In the embodiment, the second latch modules 20A/20B are connected between the first latch modules 10A/10B and the exchange module 30; the voltage conversion modules 40A/40B are connected between the exchange module 30 and the digital/analog conversion modules 50A/50B; the buffer modules 60A/60B are connected between the digital/analog conversion modules 50A/50B and the high voltage exchange module 70.

In the embodiment, the driving circuit 1 is used for driving a plurality of display data of the display. Particularly, the driving circuit 1 is a source driver circuit and can generate and output electric signals to a plurality of source signal wires so as to display the analog data.

It is noted that the first latch module 10A, the second latch module 20A, the exchange module 30, the voltage conversion module 40A, the digital/analog conversion module 50A, the buffer module 60A, and the high voltage exchange module 70 are in a same set of circuit module. The first latch module 10B, the second latch module 20B, the exchange module 30, the voltage conversion module 40B, the digital/analog conversion module 50B, the buffer module 60B, and the high voltage exchange module 70 are in another set of circuit module. In practical applications, the level shift module (not shown), according to a synchronization control signal, respectively outputs a plurality of positive digital signals and a plurality of negative digital signals to the first latch modules 10A/10B, wherein the positive digital signal has a polarity opposite to the polarity of the negative digital signal. In other words, the adjacent circuit modules execute the signals having different polarity, but not limited thereto.

In the embodiment, the first latch modules 10A/10B respectively receive the positive digital signals and the negative digital signals. It is noted that before the first latch modules 10A/10B complete receiving the plurality of digital data, the first latch modules 10A/10B will not transmit any data to other modules. In addition, after the first latch modules 10A/10B complete receiving all of the digital data, the first latch modules 10A/10B will transmit the digital data to the second latch modules 20A/20B. It is noted that the second latch modules 20A/20B and the first latch module 10A/10B have the same function and are capable of temporarily latching the data. In other words, the first latch modules 10A/10B and the second latch modules 20A/20B can be any type of buffers or latches (or latch circuits), not limited to the embodiment. In other embodiments, the first latch modules 10A/10B, according to practical requirements, can be combined with the second latch modules 20/20B to form a latch module, not limited to the embodiment.

As shown in FIG. 1, the second latch modules 20A/20B respectively transmit the digital data to the exchange module 30. In practical applications, the exchange module 30 can transmit the digital data from the second latch module 20A into the voltage conversion module 40B and transmit the digital data from the second latch module 20B into the voltage conversion module 40A. The exchange module 30 also can transmit the digital data from the second latch module 20A into the voltage conversion module 40A and transmit the digital data from the second latch module 20B into the voltage conversion module 40B. In other words, the exchange module 30 can selectively transmit the digital data having different polarity into the channel to prevent the channels from being polarized.

In addition, the voltage conversion modules 40A/40B convert the above data into a plurality of data having the voltage form compatible with the back end circuit and transmit the converted data into the digital/analog conversion modules 50A/50B. After that, the digital/analog conversion modules 50A/50B convert the digital data into the analog data and output the analog data as a plurality of analog voltages. In the embodiment, the buffer module 60A and the buffer module 60B receive the analog voltages and transmit the analog voltages to the high voltage exchange module 70. In practical applications, the high voltage exchange module 70 can transmit the voltage outputted from the buffer module 60A into the adjacent channel. In other words, the high voltage exchange module 70 can selectively transmit the analog data having different polarity to the channels to prevent the channels from being polarized.

Figure 2:
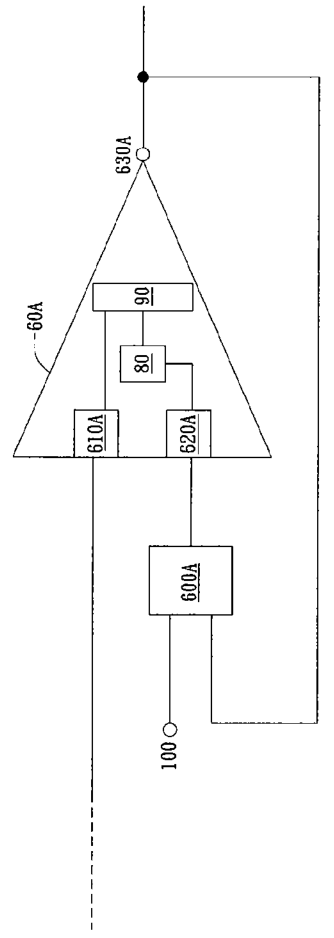
FIG. 2 is a schematic view of an embodiment of the present invention.

In addition, please refer to FIG. 2; FIG. 2 is a schematic view of an embodiment of the present invention. As shown in FIGS. 1 and 2, the buffer module 60A and the buffer module 60B have the same structure and are respectively disposed in different channels. In addition, the driving circuit 1 includes an offset unit 80 and switch modules 600A/600B, wherein the offset unit 80 is respectively disposed in the buffer module 60A and the buffer module 60B. Take the buffer module 60A for example, the buffer module 60A has a first input end 610A, a second input end 620A, and an output end 630A, wherein the first input end 610A receives an analog voltage, and the reference voltage source 100 is connected with the second input end 620A. Particularly, the switch module 600A is connected between the second input end 620A and the output end 630A, and the switch module 600A is connected between the reference voltage source 100 and the second input end 620A. In practical applications, the switch module 600A determines whether the reference voltage source 100 is electrically connected with the second input end 620A. For example, the switch module 600A can determine that the second input end 620A is electrically connected with the output end 630A, so that the reference voltage source 100 cannot be electrically connected with the second input end 620*a;* or the switch module 600A can determine that the second input end 620A is electrically connected with the reference voltage source 100, so that the output end 630A cannot be electrically connected with the second input end 620A.

In the embodiment, the reference voltage source 100 generates a reference voltage; the offset unit 80 generates an offset voltage, wherein the offset voltage and the reference voltage form a judging voltage range. As shown in FIG. 2, the offset unit 80 is disposed in the buffer module 60A to form a hysteresis comparator with the buffer module 60A, and the offset voltage is a hysteresis offset voltage. It is noted that the hysteresis offset voltage is a variable voltage, wherein the hysteresis offset voltage can be 10 mV~100 mV, but not limited thereto. In other words, the driving circuit 1 adjusts the hysteresis offset voltage to control the judging voltage range so as to slightly adjust the accuracy of the hysteresis comparator.

It is noted that the buffer module 60A includes a digital judgment unit 90, wherein the digital judgment unit 90 receives the analog voltage and the judging voltage range and, according as whether the analog voltage is within the judging voltage range, selectively outputs a plurality of digital signals, wherein the digital signals include the pass logic signal and the fail logic signal. In practical applications, the switch module 600A determines that the reference voltage source 100 is electrically connected with the second input end 620A, so that the reference voltage source 100 transmits the reference voltage to the second input end 620A, and the digital judgment unit 90, according to the judging voltage range formed from the offset voltage and the reference voltage, determines whether the analog voltage is within the judging voltage range.

In practical applications, a sum of the reference voltage and the offset voltage is an upper limit of the judging voltage range; a difference between the reference voltage and the offset voltage is a lower limit of the judging voltage range. The upper limit and the lower limit form the judging voltage range. It is noted that the buffer module 60A, according as whether the analog voltage is within the judging voltage range, outputs the pass logic signal or the fail logic signal at the output end 630A. Furthermore, when the analog voltage falls within the judging voltage range, the buffer module 60A outputs the pass logic signal at the output end 630A; when the analog voltage falls out of the judging voltage range, the buffer module 60A outputs the fail logic signal at the output end 630A.

Figure 3A:
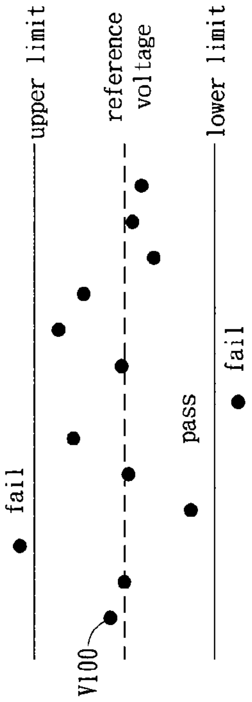
FIG. 3A is a schematic view of a conventional judgment mechanism.
Figure 3B:
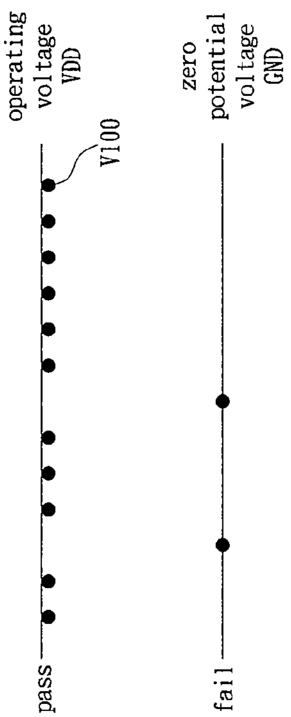
FIG. 3B is a schematic view of an embodiment of the digital judgment mechanism of the present invention.
Figure 3C:
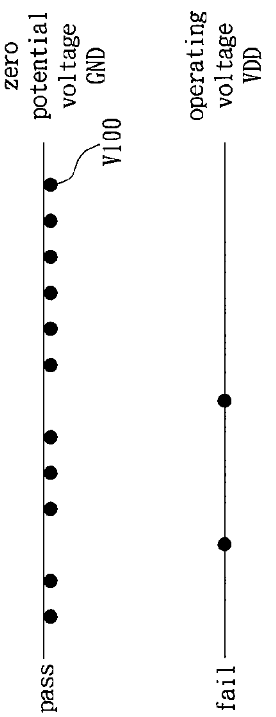
FIG. 3C is a schematic view of another embodiment of the digital judgment mechanism of the present invention.

Please refer to FIGS. 3A, 3B, and 3C, wherein FIG. 3A is a schematic view of a conventional judgment mechanism; FIG. 3B is a schematic view of an embodiment of the digital judgment mechanism of the present invention; FIG. 3C is a schematic view of another embodiment of the digital judgment mechanism of the present invention. As shown in FIG. 3A, the conventional judgment mechanism utilizes a reference voltage, an upper limit, and a lower limit to generate an analog judgment result. However, in practical applications, the conventional judgment mechanism requires confirming whether each analog voltage value V100 is between the upper limit and the lower limit; thus it is time consuming and low efficiency.

On the contrary, the digital judgment unit 90 of the buffer module 60A of the present invention utilizes the digital judgment mechanism to generate a digital signal. For example, as shown in FIG. 3B, the buffer module 60A has an operating voltage VDD and a zero potential voltage GND, wherein the pass logic signal is the operating voltage VDD, and the fail logic signal is the zero potential voltage GND. In other words, the digital judgment unit 90 respectively utilizes the operating voltage VDD and the zero potential voltage GND of the buffer module 60A to generate the pass logic signal and the fail logic signal so as to effectively judge the accuracy of the analog voltage V100. In another embodiment, as shown in FIG. 3C, the pass logic signal is the zero potential voltage, and the fail logic signal is the operating voltage, so the buffer module 60A can selectively determine the digital signal corresponding the zero potential voltage GND and the operating voltage VDD according to practical situations. Compared to the analog judgment result of FIG. 3A, the pass logic signal of FIG. 3B and the fail logic signal of FIG. 3C are the digital logic signals and have high accuracy to increase the judgment efficiency.

In addition, the present invention further provides other embodiments to illustrate variant embodiments for the driving circuit.

Figure 4:
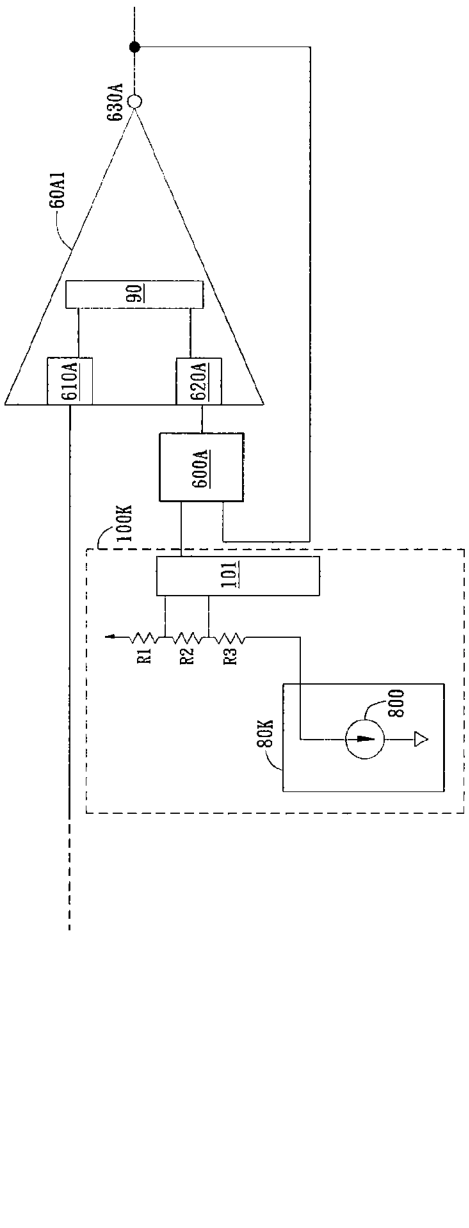
FIG. 4 is a schematic view of another embodiment of the buffer module of the present invention.

Please refer to FIG. 4; FIG. 4 is a schematic view of another embodiment of the buffer module of the present invention. As shown in FIG. 4, the offset unit 80K is disposed in the reference voltage source 100K rather than in the buffer module 60A1. In the embodiment, the reference voltage source 100K includes a multiplexer 101, a plurality of resistors R1, R2, R3, . . . , and an offset unit 80K, wherein the multiplexer 101 is coupled with the resistors and the offset unit 80K. The reference voltage source 100K generates the partial voltage by the resistors R1, R2, R3, etc., so that the reference voltage source 100K can generate the reference voltage having different amplitudes. For example, the multiplexer 101 is coupled with the coupling node between the resistors, wherein the multiplexer 101 is coupled between the resistor R1 and the resistor R2 and coupled between the resistor R2 and the resistor R3, and so on. In addition, the offset unit 80K is coupled with the resistors and has an offset source 800, and the offset source 800 generates the offset voltage. In practical applications, the reference voltage can be 9 V, 10 V, 11 V, or other voltage values, and the offset voltage can be 10 mV~100 mV, but not limited thereto. In other words, the offset unit 80K is disposed in the at reference voltage source 100K to form an offset source with the reference voltage source 100K, and the offset source outputs the judging voltage range. Furthermore, the reference voltage source 100K is an integration voltage source; the integration voltage source integrates the reference voltage and the offset voltage to form the judging voltage range and transmits the judging voltage range to the buffer module 60A1.

For example, when the reference voltage is 10 V and the offset voltage is 10 mV, the upper limit is 10.01 V, the lower limit is 9.99 V, and the judging voltage range is between 9.99 V and 10.01 V. In practical applications, when the analog voltage is 10 V and falls within the judging voltage range, the buffer module 60A1 outputs the pass logic signal at the output end 630*a*. In addition, when the analog voltage is 10.02 V and falls out of the judging voltage range, the buffer module 60A1 outputs the fail logic signal at the output end 630A. Particularly, the buffer module 60A1 utilizes the digital judgment unit 90 to receive the analog voltage and the judging voltage range, and the digital judgment unit 90 outputs the pass logic signal or the fail logic signal according as whether the analog voltage is within the judging voltage range.

Figure 5A:
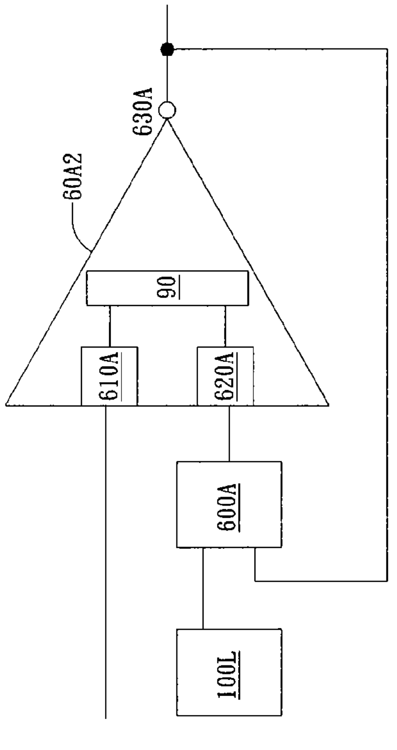
FIG. 5A is a schematic view of another embodiment of the buffer module of the present invention.
Figure 5B:
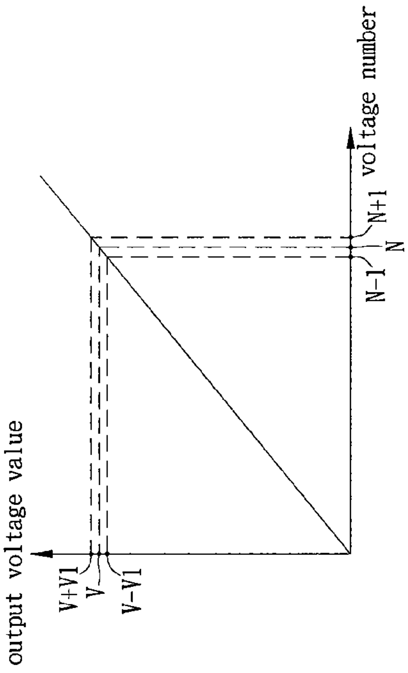
FIG. 5B is a curve diagram of the voltage versus the voltage number.

Please refer to FIGS. 5A and 5B; FIG. 5A is a schematic view of another embodiment of the buffer module of the present invention; FIG. 5B is a curve diagram of the voltage versus the voltage number. As shown in FIG. 5A, the second input end 620A of the buffer module 60A2 is connected with the reference voltage source 100L through the switch module 600A, wherein the offset unit (not shown) is disposed in the reference voltage source 100L to form an offset source with the reference voltage source 100L, and the offset source has a plurality of voltage numbers N. In practical applications, the analog voltage corresponds to one voltage number N. In addition, as shown in FIG. 5B, each voltage number N in a sequence corresponds an output voltage value and has a former voltage number N-1 and a latter voltage number N+1, wherein the output voltage value of the former voltage number N−1 is V−V1; the output voltage value of the voltage number N is V; the output voltage value of the latter voltage number is V+V1. It is noted that the output voltage values V−V1 and V+V1, which respectively correspond to the former voltage number N−1 and the latter voltage number N+1, form the judging voltage range.

In the embodiment, V1 is 10 mV, but not limited to the embodiment. In practical applications, if the output voltage value of the voltage number N is 10 V, the output voltage value of the former voltage number N−1 is 9.99 V, and the output voltage value of the latter voltage number N+1 is 10.01 V, so that the judging voltage range is between 9.99 V~10.01 V. It is noted that one analog voltage corresponds one voltage number N; if the analog voltage falls within the judging voltage range, the digital judgment unit outputs the pass logic signal; if the analog voltage falls out of the judging voltage range, the digital judgment unit outputs the fail logic signal.

All of the driving circuits of FIG. 1 through FIG. 5 utilize the digital judgment unit of the buffer module to determine whether the analog voltage received by the buffer module is pass or fail and yet cannot determine whether the voltage outputted from the buffer module is pass or fail. For the issue, the present invention utilizes the embodiments of FIG. 6 and FIG. 7 to further illustrate the effect of the judgment mechanism.

Figure 6:
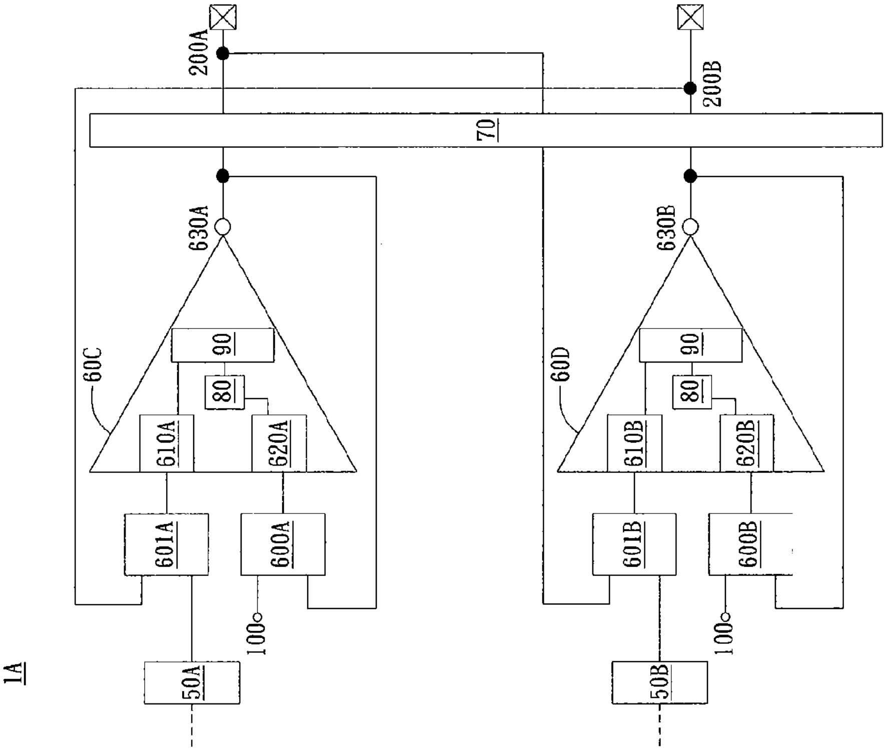
FIG. 6 is a schematic view of another embodiment of the driving circuit of the present invention.

Please refer to FIG. 6; FIG. 6 is a schematic view of another embodiment of the driving circuit of the present invention. In the embodiment, the at least one buffer module includes a first buffer module 60C and a second buffer module 60D, wherein the first buffer module 60C and the second buffer module 60D are disposed in channels having different polarity. In other words, the first buffer module 60C and the second buffer module 60D are disposed in the adjacent channels. It is noted that the first buffer module 60C and the second buffer module 60D are the same as the buffer module 60A of FIG. 2, but not limited to the embodiment. In other embodiments, the present invention can apply the buffer modules 60A1 and 60A2 in the embodiment of FIG. 6, not limit to the embodiment.

In addition, a switch 601A is coupled between the first input end 610A of the first buffer module 60C and the digital/analog conversion module 50A and coupled between the first input end 610A of the first buffer module 60C and the coupling node 200B. A switch 601B is coupled between the first input end 610B of the second buffer module 60D and the digital/analog conversion module 50B and coupled between the first input end 610B of the second buffer module 60D and the coupling node 200A.

As shown in FIG. 6, the first buffer module 60C transmits the analog voltage from the output end 630A to the first input end 610B of the second buffer module 60D, so that the second buffer module 60D determines whether the analog voltage outputted from the first buffer module 60C falls within the judging voltage range. Particularly, the first buffer module 60C transmits the analog voltage to the switch 601B through the coupling node 200A, and the switch 601B determines the coupling node 200A to be electrically connected with the first input end 610B, so that the second buffer module 60D receives the analog voltage outputted from the first buffer module 60C. Furthermore, the second buffer module 60D can utilize the digital judgment unit 90 to judge the analog voltage outputted from the first buffer module 60C to confirm whether the analog falls within the judging voltage range, further generating the pass logic signal or the fail logic signal. Similarly, the second buffer module 60D can transmit the analog voltage to the switch 601A through the coupling node 200B, so that the first buffer module 60C receives the analog voltage outputted from the second buffer module 60D. Furthermore, the first buffer module 60C can utilize the digital judgment unit 90 to judge the analog voltage outputted from the second buffer module 60D to confirm whether the analog falls within the judging voltage range, further generating the pass logic signal or the fail logic signal.

In other words, the firs buffer module 60C and the second buffer module 60D can selectively determine the accuracy of the analog voltage outputted from the second buffer module 60D and the first buffer module 60C, further outputting the pass logic signal or the fail logic signal. Compared to the embodiments of the FIG. 1 through FIG. 5, the embodiment of FIG. 6 has a much more excellent accuracy.

Figure 7A:
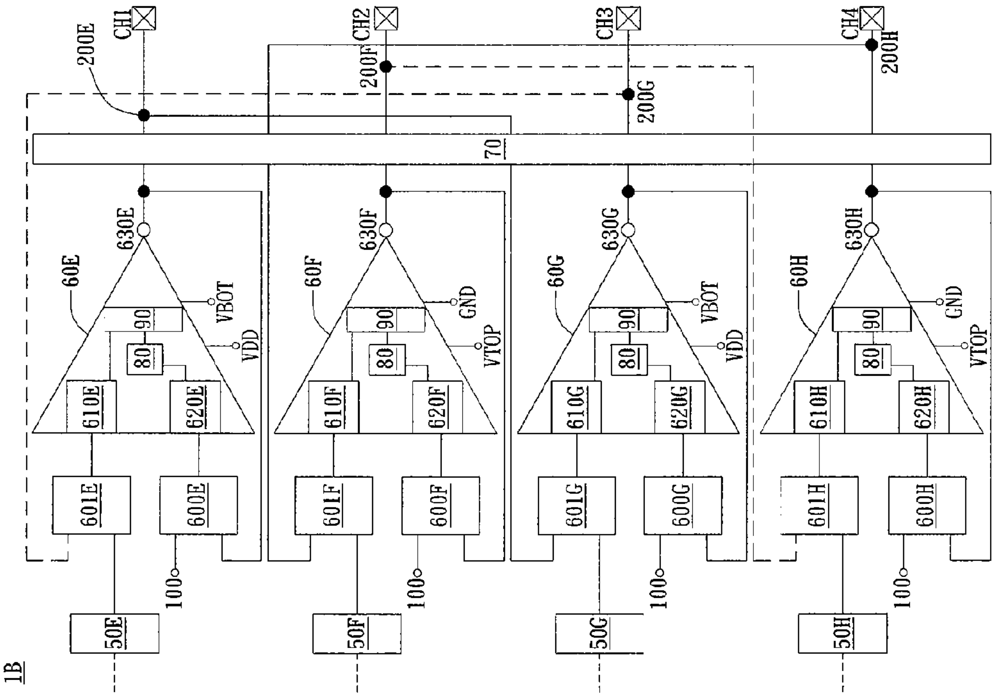
FIG. 7A is a schematic view of another embodiment of the driving circuit of the present invention.
Figure 7B:
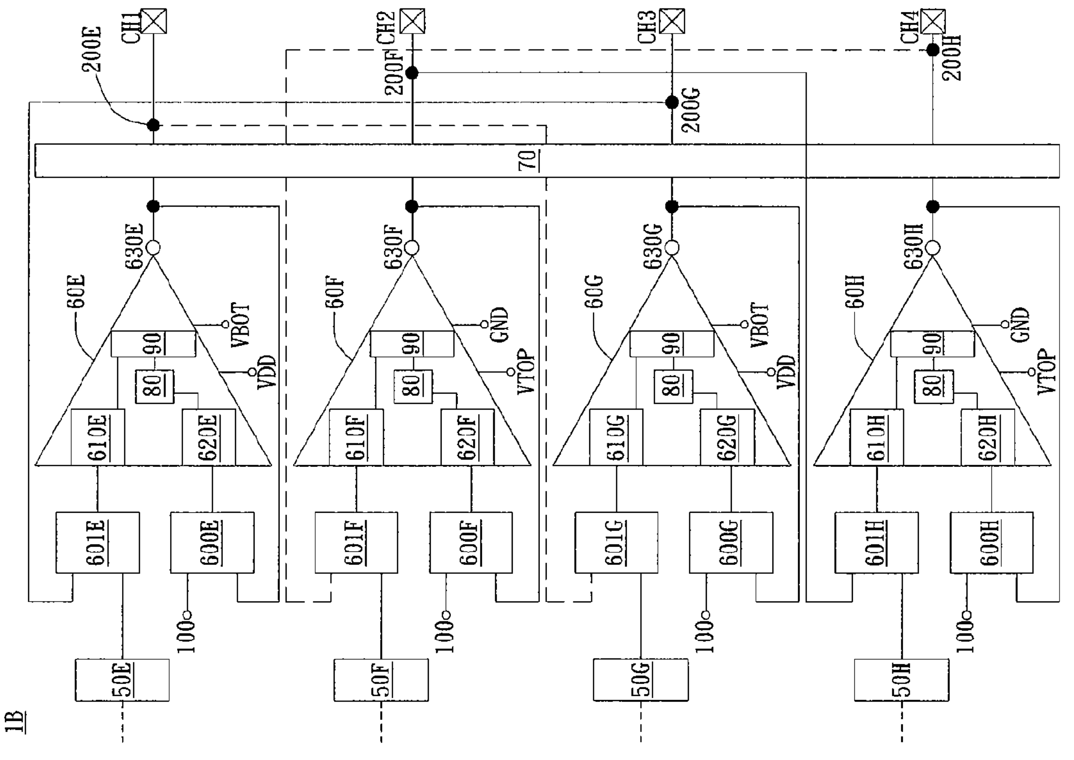
FIG. 7B is a schematic view of another embodiment of the driving circuit of the present invention.

Please refer to FIGS. 7A and 7B; FIGS. 7A and 7B are respectively schematic views of another embodiment of the driving circuit of the present invention. The embodiment of FIGS. 7A and 7B is the driving circuit 1B, wherein the driving circuit 1B has a first channel CH1, a second channel CH2, a third channel CH3, and a fourth channel CH4. Similar to the embodiment of the FIG. 6, through the switches 601E/601F/601G/601H, the buffer modules 60E/60F/60G/60H are respectively connected between the digital/analog conversion modules 50E/50F/50G/50H and the coupling nodes 200G/200H/200E/200F.

It is noted that the buffer modules 60E, 60F, 60G, and 60H are the same as the buffer module 60A of FIG. 2, but not limited to the embodiment. In other embodiments, the present invention can apply the buffer modules 60A1 and 60A2 to the embodiments of FIGS. 7A and 7B, but not limited to the embodiment. In addition, the first channel CH1 and the third channel CH3 have the voltage data with the same polarity; the second channel CH2 and the fourth channel CH4 have the voltage data with the same polarity. In other words, the buffer module 60E and the buffer module 60G are disposed in the channels having the same polarity; the buffer module 60F and the buffer module 60H are disposed in the channels having the same polarity.

It is noted that the difference between FIG. 7A and 7B is that the connecting line between the coupling nodes 200E/200F/200G/200H and the switches 601E/601F/601G/601H are the dashed lines or the solid lines, wherein the solid line represents that the connected modules therewith is driven, the dashed line represents the connected modules therewith is not driven.

In practical applications, as shown in FIG. 7A, the buffer module 60E can transmit the analog voltage to the switch 601G through the coupling node 200E, so that the buffer module 60G receives the analog voltage outputted from the buffer module 60E. Furthermore, the buffer module 60G can utilize the digital judgment unit 90 to judge the analog voltage outputted from the buffer module 60E to confirm whether the analog voltage falls within the judging voltage range or not, further generating the pass logic signal or the fail logic signal. In addition, the buffer module 60H can transmit the analog voltage to the switch 601F through coupling node 200H, so that the buffer module 60F receives the analog voltage outputted from buffer module 60H. Furthermore, the buffer module 60F can utilize the digital judgment unit 90 to judge the analog voltage outputted from the buffer module 60H to confirm whether the analog voltage falls within the judging voltage range or not, further generating the pass logic signal or the fall logic signal.

As shown in FIG. 7A, the buffer module 60F can utilize the coupling node 200F to transmit the analog voltage to the switch 601 H, so that the buffer module 60H receives the analog voltage outputted from the buffer module 60F. Furthermore, the buffer module 60H can utilize the digital judgment unit 90 to judge the analog voltage outputted from the buffer module 60F to confirm whether the analog voltage falls within the judging voltage range, further generating the pass logic signal or the fail logic signal. Similarly, the buffer module 60G can utilize the coupling node 200G to transmit the analog voltage to the switch 601E, so that the buffer module 60E receives the analog voltage outputted from the buffer module 60G. Furthermore, the buffer module 60E can utilize the digital judgment unit 90 to judge the analog voltage outputted from the buffer module 60G to confirm whether the analog voltage falls within the judging voltage range, further generating the pass logic signal or the fail logic signal.

It is noted that the driving circuits of FIGS. 7A and 7B transmit the analog voltage to the channels having the same polarity to effectively save the power so as to increase the judgment efficiency and power-saving. For example, if the first buffer module 60C of FIG. 6 utilizing the digital judgment unit 90 to perform the judgment consumes the voltage of 10 V, the buffer module 60E performing the judgment consumes the voltage of only 5 V that is about a half of 10 V, but not limited to the embodiment. In practical applications, the consumption of the voltage depends on a difference between the operating voltage and the partial voltage or a difference between the partial voltage and the zero potential voltage. As shown in FIGS. 7A and 7B, the buffer modules 60E and 60G have the operating voltage VDD and the partial voltage VBOT (bottom voltage); the buffer modules 60F and 60H have the zero potential voltage GND and the partial voltage VTOP (top voltage). It is noted that the partial voltage VBOT and the partial voltage VTOP are respectively the partial voltage value of the operating voltage VDD. In other words, the voltage value of the partial voltages VBOT and VTOP is between the operating voltage VDD and the zero potential voltage GND. In the embodiment, the voltage value of the partial voltage VBOT and VTOP is a half of the operating voltage VDD, but not limited to the embodiment. In other words, the buffer modules 60E, 60F, 60G, 60H can respectively utilize the difference between the operating voltage VDD and the partial voltage VBOT, the difference between the partial voltage VTOP and the zero potential voltage GND, the difference between the operating voltage VDD and the partial voltage VBOT, and the difference between the partial voltage VTOP and the zero potential voltage GND to drive the digital judgment unit 90 to execute the judgment operation. In practical applications, the driving circuit 1B has the effect of digital judgment and power-saving.

Compared to prior arts, the driving circuit of the present invention utilizes the buffer module to determine the accuracy of the analog voltage and executes the digital logic test according as whether the analog voltage falls within the judging voltage range. Furthermore, the buffer module is a digital judgment buffer module and can determine the accuracy of the voltage by the digital logic mechanism so as to greatly decrease the test time. In addition, the driving circuit of the present invention is a BIST (Built-In-Self-Test) circuit which can directly execute the test in the original module (the driving circuit) without utilize additional test apparatus so as to decrease the cost of the hardware.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

The invention claimed is:

1. A driving circuit connected with a display module, comprising:

at least one reference voltage source generating a reference voltage;

at least one offset unit generating an offset voltage, wherein the offset voltage and the reference voltage form a judging voltage range; and at least one buffer module having a first input end, a second input end, and an output end, and the at least one buffer module comprises a first buffer module and a second buffer module, wherein the first input end receives an analog voltage, the at least one reference voltage source is connected with the second input end, the at least one buffer module, according as whether the analog voltage is within the judging voltage range, outputs a pass logic signal or a fail logic signal at the output end, wherein the first buffer module transmits the analog voltage from the output end to the first input end of the second buffer module, so that the second buffer module determines whether the analog voltage outputted from the first buffer module falls within the judging voltage range.

2. The driving circuit of claim 1, wherein the at least one buffer module comprises:

a digital judgment unit receiving the analog voltage and the judging voltage range and, according as whether the analog voltage is within the judging voltage range, selectively outputting a plurality of digital signals, wherein the digital signals comprise the pass logic signal and the fail logic signal.

3. The driving circuit of claim 1, wherein the offset unit is disposed in the at least one buffer module to form at least one hysteresis comparator with the at least one buffer module, the offset voltage is a hysteresis offset voltage, and the hysteresis offset voltage is a variable voltage.

4. The driving circuit of claim 1, wherein a sum of the reference voltage and the offset voltage is an upper limit of the judging voltage range, and a difference between the reference voltage and the offset voltage is a lower limit of the judging voltage range, and the upper limit and the lower limit form the judging voltage range.

5. The driving circuit of claim 1, wherein the offset unit is disposed in the at least one reference voltage source and has an offset current source, and the offset current source generates the offset voltage.

6. The driving circuit of claim 1, wherein the offset unit is disposed in the at least one reference voltage source to form an offset source with the at least one reference voltage source, and the offset source outputs the judging voltage range.

7. The driving circuit of claim 1, wherein the at least one offset unit is disposed in the at least one reference voltage source to form an offset source, and the offset source has a plurality of voltage numbers, the analog voltage corresponds to one voltage number; each voltage number in a sequence corresponds an output voltage value and has a former voltage number and a latter voltage number; the output voltage values which respectively correspond to the former voltage number and the latter voltage number form the judging voltage range.

8. The driving circuit of claim 1, further comprising:

a switch module connected between the second input end and the output end, wherein the switch module determines whether the reference voltage source is electrically connected with the second input end.

9. The driving circuit of claim 1, wherein when the analog voltage falls within the judging voltage range, the at least one buffer module outputs the pass logic signal at the output end.

10. The driving circuit of claim 1, wherein when the analog voltage falls out of the judging voltage range, the at least one buffer module outputs the fail logic signal at the output end.

11. The driving circuit of claim 1, wherein the first buffer module and the second buffer module are disposed in channels having a same polarity, the at least one buffer module has an operating voltage, a partial voltage, and a zero potential voltage, and the at least one buffer module utilizes a difference between the operating voltage and the partial voltage or a difference between the partial voltage and the zero potential voltage to drive the digital judgment unit.

12. The driving circuit of claim 1, wherein the first buffer module and the second buffer module are disposed in channels having different polarity.

13. The driving circuit of claim 1, wherein the at least one buffer module has an operating voltage and a zero potential voltage, the pass logic signal is the operating voltage, and the fail logic signal is the zero potential voltage.

14. The driving circuit of claim 1, wherein the at least one buffer module has an operating voltage and a zero potential voltage, the pass logic signal is the zero potential voltage, and the fail logic signal is the operating voltage.

* * * * *